US009910112B2

United States Patent
Soejima

(10) Patent No.: US 9,910,112 B2
(45) Date of Patent: Mar. 6, 2018

(54) NOISE SUPPRESSION FOR MRI SIGNALS DIRECTLY SAMPLED AND DIGITIZED IN IMAGING ROOM

(71) Applicant: TOSHIBA MEDICAL SYSTEMS CORPORATION, Otawara-shi, Tochigi (JP)

(72) Inventor: Kazuyuki Soejima, Nasushiobara (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 681 days.

(21) Appl. No.: 14/326,790

(22) Filed: Jul. 9, 2014

(65) Prior Publication Data

US 2015/0015256 A1 Jan. 15, 2015

(30) Foreign Application Priority Data

Jul. 12, 2013 (JP) .................................. 2013-147129

(51) Int. Cl.
*G01R 33/36* (2006.01)

(52) U.S. Cl.
CPC ...... *G01R 33/3621* (2013.01); *G01R 33/3692* (2013.01)

(58) Field of Classification Search
USPC ........................ 324/300–322; 600/407–435
See application file for complete search history.

(56) References Cited

U.S. PATENT DOCUMENTS

| 4,135,247 A | * | 1/1979 | Gordon | A61B 6/032 378/11 |
|---|---|---|---|---|
| 6,297,637 B1 | * | 10/2001 | Feld | G01R 33/3621 324/322 |
| 6,624,777 B2 | | 9/2003 | Miyano | 324/322 |
| 7,518,541 B2 | | 4/2009 | Yoshizawa | 324/322 |
| 7,560,933 B2 | * | 7/2009 | Yoshizawa | G01R 33/3621 324/318 |
| 8,907,672 B2 | | 12/2014 | Hori et al. | 324/309 |

(Continued)

FOREIGN PATENT DOCUMENTS

| JP | 1993-190609 | 7/1993 |
|---|---|---|
| JP | 2002-353812 | 12/2002 |

(Continued)

*Primary Examiner* — Melissa Koval
*Assistant Examiner* — Tiffany Fetzner
(74) *Attorney, Agent, or Firm* — Nixon & Vanderhye P.C.

(57) ABSTRACT

According to one embodiment, an MRI apparatus includes a data acquisition unit and an image generation unit. The data acquisition unit acquires an analog MR signal from an object and converts the analog MR signal into a digital MR signal. The image generation unit generates MR image data based on the digital MR signal. The data acquisition unit includes an AD converter, a signal processing part and a noise suppression part. The AD converter converts the analog MR signal, before a down conversion, into the digital MR signal, inside an imaging room. The signal processing part performs signal processing of the digital MR signal, inside the imaging room or outside the imaging room. The noise suppression part suppresses a noise arising caused by a conversion from the analog MR signal, before the down conversion, into the digital MR signal.

10 Claims, 5 Drawing Sheets

(56) References Cited

U.S. PATENT DOCUMENTS

| | | | |
|---|---|---|---|
| 8,947,091 B2 | 2/2015 | Nakanishi et al. | 324/322 |
| 9,784,805 B2 * | 10/2017 | Saes | G01R 33/341 |
| 2008/0258732 A1 * | 10/2008 | Yoshizawa | G01R 33/3607 |
| | | | 324/322 |
| 2010/0259261 A1 * | 10/2010 | Saes | G01R 33/3621 |
| | | | 324/309 |
| 2015/0015256 A1 * | 1/2015 | Soejima | G01R 33/3621 |
| | | | 324/309 |

FOREIGN PATENT DOCUMENTS

| | | |
|---|---|---|
| JP | 2004-152717 | 5/2004 |
| JP | 2006-074467 | 3/2006 |
| JP | 2006-129951 | 5/2006 |
| JP | 2008-000328 | 1/2008 |
| JP | 2009-529289 | 8/2009 |
| JP | 2011-092553 | 5/2011 |
| WO | 2007/102981 A2 | 9/2007 |
| WO | 2012/173095 A1 | 12/2012 |

* cited by examiner

44= Noise Supression
47= Low Voltage Differential Signaling (LVDS)
48= Ground Plane
49= Shields
50= Connectors

| TIME [ns] | SINC WAVEFORM | LOGIC | BIT NUMBER |
|---|---|---|---|
| 0 | 8 | 00001000 | 1 |
| 10 | 48 | 00110000 | 2 |
| 20 | -74 | 10110110 | 5 |
| 30 | 47 | 00101111 | 5 |
| 40 | 18 | 00010010 | 2 |

Bit encoding/decoding

NOISE SUPPRESSION FOR MRI SIGNALS DIRECTLY SAMPLED AND DIGITIZED IN IMAGING ROOM

CROSS REFERENCES TO RELATED APPLICATIONS

This application is based upon and claims the benefit of priority from Japanese Patent Application No. 2013-147129, filed on Jul. 12, 2013; the entire contents of which are incorporated herein by reference.

FIELD

Embodiments described herein relate generally to an MRI (magnetic resonance imaging) apparatus and a magnetic resonance imaging method.

BACKGROUND

The MRI apparatus is an imaging diagnostic apparatus which magnetically excites nuclear spins of an object set in a static magnetic field with RF (radio frequency) signals having the Larmor frequency and reconstructs an image based on MR (magnetic resonance) signals generated due to the excitation.

In MRI apparatuses, a technology called direct sampling, which performs AD (analog to digital) conversion directly without a frequency conversion to a lower frequency (down conversion) of analog MR echo signals, has been developed. When direct sampling of MR signals is performed, down conversion is performed to digitalized MR echo signals after the AD conversion.

An imaging system including a static field magnet, gradient coils, and RF coils and the like out of elements of an MRI apparatus is placed in an imaging room. On the other hand, a transmission system of RF signals and a reception system of MR signals are placed in a machine room magnetically shielded from the imaging room in order to avoid influence of magnetic fields.

However, there are needs to introduce an MRI apparatus to a medical institution, which has difficulty in securing a sufficient space for installing an MRI apparatus, in recent years. Moreover, there are needs to change an outdated MRI apparatus of a low magnetic field type into an updated MRI apparatus of a high magnetic field type as well. In this case, widths of an imaging room and a machine room which were designed for installing an outdated MRI apparatus of a low magnetic field type may possibly be insufficient. From such background, it is desired to be able to install a reception system of MR signals in an imaging room.

Accordingly, it is an object of the present invention to provide a magnetic resonance imaging apparatus and a magnetic resonance imaging method which can place at least a part of a reception system, for receiving MR signals by direct sampling, in an imaging room.

DETAILED DESCRIPTION

In general, according to one embodiment, a magnetic resonance imaging apparatus includes a data acquisition unit and an image generation unit. The data acquisition unit is configured to acquire an analog magnetic resonance signal from an object and to convert the analog magnetic resonance signal into a digital magnetic resonance signal. The image generation unit is configured to generate magnetic resonance image data based on the digital magnetic resonance signal. The data acquisition unit includes an AD converter, a signal processing part and a noise suppression part. The AD converter is configured to convert the analog magnetic resonance signal, before a down conversion, into the digital magnetic resonance signal, inside an imaging room. The signal processing part is configured to perform signal processing of the digital magnetic resonance signal, inside the imaging room or outside the imaging room. The noise suppression part is configured to suppress a noise arising caused by a conversion from the analog magnetic resonance signal, before the down conversion, into the digital magnetic resonance signal.

Further, according to another embodiment, a magnetic resonance imaging method includes: acquiring an analog magnetic resonance signal from an object and converting the analog magnetic resonance signal into a digital magnetic resonance signal; and generating magnetic resonance image data based on the digital magnetic resonance signal. The analog magnetic resonance signal before a down conversion is converted into the digital magnetic resonance signal, inside an imaging room. Signal processing of the digital magnetic resonance signal is performed inside the imaging room or outside the imaging room. A noise arising caused by a conversion from the analog magnetic resonance signal, before the down conversion, into the digital magnetic resonance signal is suppressed.

A magnetic resonance imaging apparatus and a magnetic resonance imaging method according to embodiments of the present invention will be described with reference to the accompanying drawings.

Figure 1:
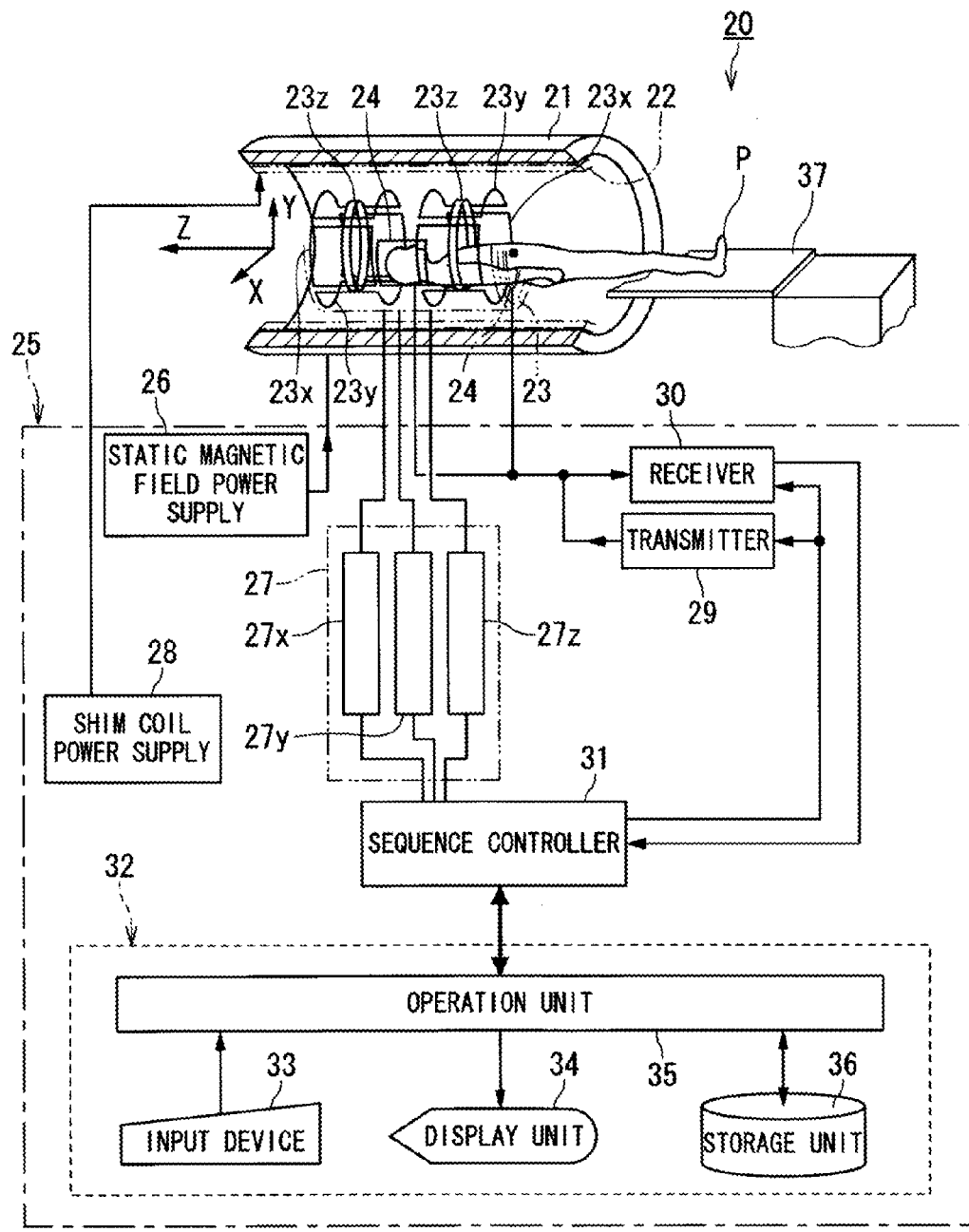
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits RF signals given from the transmitter 29 to the object P. The reception RF coil 24 receives MR signals generated due to nuclear spins inside the object P which are excited by the RF signals to give to the receiver 30.

The sequence controller 31 of the control system 25 communicates with the gradient power supply 27, the transmitter 29 and the receiver 30. The sequence controller 31 stores sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined stored sequence. The control information above-described includes motion control information, such as intensity, impression period and impression timing of the electric current pulse which should be impressed by the gradient power supply 27.

The sequence controller 31 is also configured to give raw data to the computer 32. The raw data is complex-valued data obtained through the detection of a MR signal and A/D (analog to digital) conversion to the MR signal detected in the receiver 30.

The transmitter 29 gives an RF signal to the RF coil 24 in accordance with control information provided from the sequence controller 31. The receiver 30 generates raw data which is digitized complex-valued numerical data by detecting a MR signal given from the RF coil 24 and performing predetermined signal processing and A/D converting to the MR signal detected. The receiver 30 also gives the generated raw data to the sequence controller 31.

The computer 32 is configured for various functions by the operation unit 35 executing some programs stored in the storage unit 36 of the computer 32. Alternatively, some specific circuits having various functions may be provided with the magnetic resonance imaging apparatus 20 instead of using at least a part of the computer programs.

Specifically, the operation unit 35 of the computer 32 has a function to set imaging conditions including a pulse sequence to output the imaging conditions to the sequence controller 31, a function to generate MR image data by image reconstruction processing, including FT (Fourier transform), of MR signals output from the sequence controller 31, and a function to perform various image processing of MR image data.

That is, the computer 32 has a function as an image generation system which generates MR image data based on digital MR signals. On the other hand, a data acquisition system, which acquires analog MR signals from an object P to convert the analog MR signals into digital MR signals, is formed using the static field magnet 21, the gradient coil 23, and the RF coils 24.

Next, a detailed composition and detailed functions of the receiver 30 composing the data acquisition system will be explained. The receiver 30 is configured to sample MR signals by direct sampling by which MR signals received by a reception RF coil 24 are subjected to AD conversion without frequency conversion.

Figure 2:
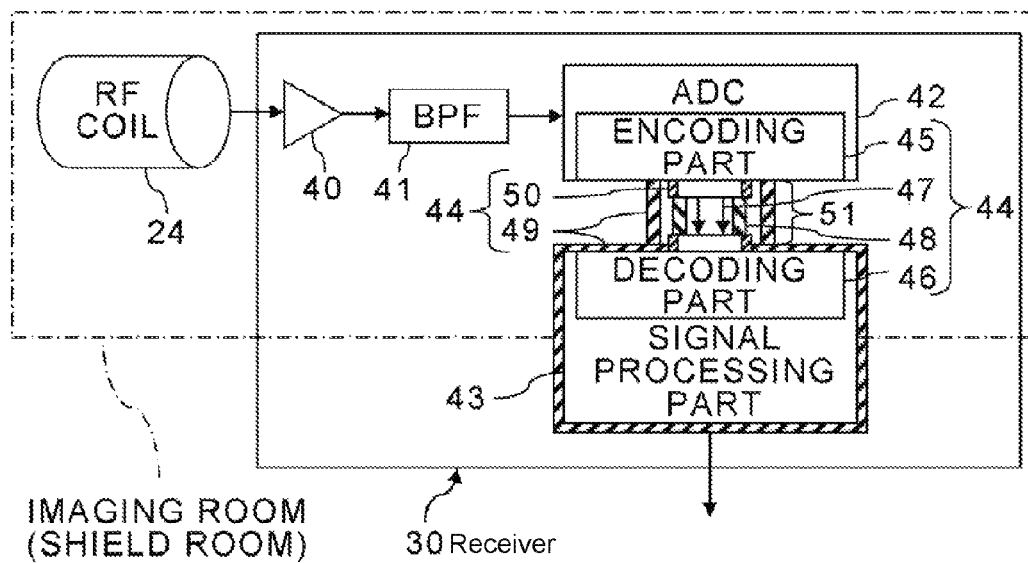
FIG. 2 is a functional block diagram showing a detailed configuration of the receiver shown in FIG. 1.

FIG. 2 is a functional block diagram showing a detailed configuration of the receiver 30 shown in FIG. 1.

The receiver 30 has an amplifier 40, a BPF (band pass filter) 41, an ADC (AD converter) 42, and a signal processing part 43. The amplifier 40, and the BPF41 and the ADC42 can be placed in an imaging room as a shield room in which the static field magnet 21, the gradient coil 23, and the RF coil 24 are placed. Therefore, a part of the receiver 30 may be integrated with the reception RF coil 24. Especially, in the case where the RF coil 24 is a type which wirelessly transmits MR signals, a part of the receiver 30 is generally an element of the reception RF coil 24. On the other hand, the signal processing part 43 is installed inside the imaging room or outside the imaging room.

The MR signals received by the reception RF coil 24 are amplified by the amplifier 40 to be input to the BPF41. The analog MR signals whose noise outside a reception band of the MR signals has been removed by restriction of a frequency band in the BPF41 are subjected to digital conversion in the ADC 42, without a frequency conversion. That is, the analog MR signals, before a down conversion, received by the RF coil 24 are converted into digital MR signals in the ADC 42. Thus, digital sampling of the MR signals is performed in the receiver 30.

On the other hand, signal processing including a down conversion of the digital MR signals is performed in the signal processing part 43. Specifically, digital filter processing using a decimation filter or the like for removing noises is performed. In addition, processing, such as IQ separation processing, IQ synthesizing processing, and resampling, is performed, as needed.

When the ADC 42 is installed in the imaging room as shown in FIG. 2, noises arising caused by the digitized MR signals become a problem. Each digitized MR signal is quantized to be plural pieces of bit information. Then, each bit is transmitted from the ADC 42 to the signal processing part 43. As a result, spurious noises, each having a component in a frequency band of the MR echo signals received by the RF coil 24, arise.

Especially, in case of installing the ADC 42 inside the imaging room, the RF coil 24 having a high sensitivity becomes close to the ADC 42. For this reason, spurious noises which have arisen in the output side of the ADC 42 are likely to contaminate the RF coil 24 through the ground (GND), signal lines, power supply lines, and the space. The noise contamination into the RF coil 24 causes generation of an artifact.

Figure 3:
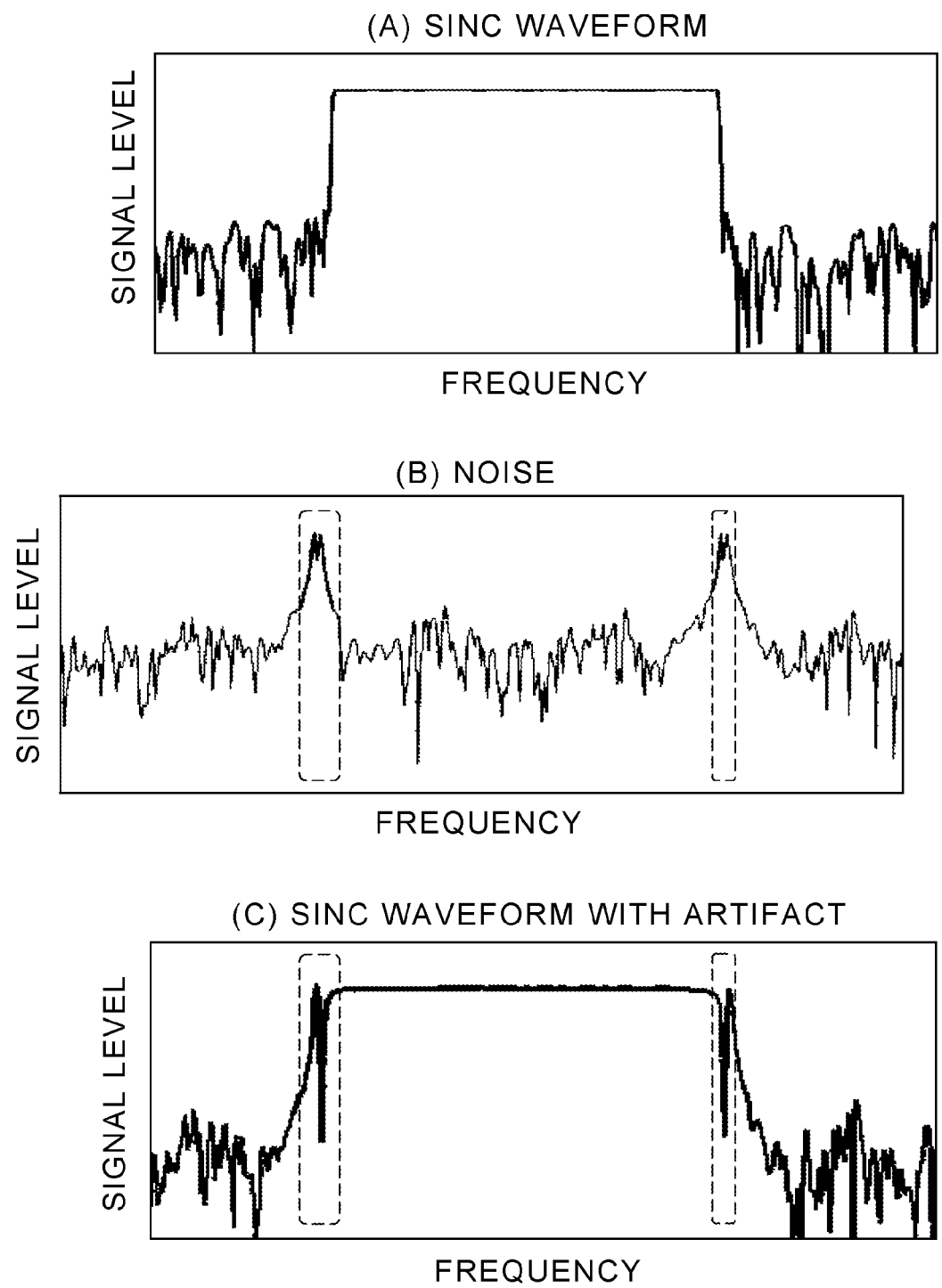
FIG. 3 shows an example of digital noise generated by the ADC shown in FIG. 2.

FIG. 3 shows an example of digital noise generated by the ADC42 shown in FIG. 2.

In FIGS. 3(A), (B), and (C), each horizontal axis represents frequencies and each vertical axis represents relative signal intensities. Moreover, in FIG. 3, (A) shows a waveform of a sinc function, (B) shows a pseudo waveform of digital noise, which arises in the latter part of the ADC 42, generated by a simulation, and (C) shows a state where artifacts have arisen in the sinc waveform shown in (A), caused by the digital noise shown in (B), respectively.

When the sinc waveform having the center frequency of 63.86 [MHz] as shown in FIG. 3(A) is quantized by 8 [bit], 100 MSPS (Megasamples per second), and the twos complement, a noise become like one shown in FIG. 3(B).

Figures 4, 5:
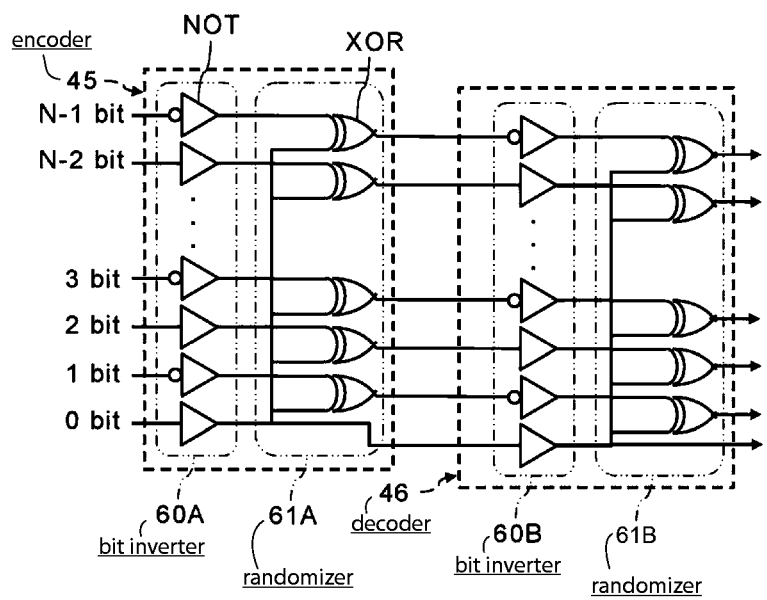
FIG. 4 is a table showing a calculation method of the digital noise shown in FIG. 3(B)
FIG. 5 is a circuit diagram showing an example of the encoding part and the decoding part shown in FIG. 2.

FIG. 4 is a table showing a calculation method of the digital noise shown in FIG. 3(B).

As shown in FIG. 4, the number of bits, whose values are 1, among the 8 bits indicating an intensity of the sinc waveform at each time can be considered as a level of the radiated noise. By calculating noises with this method, waveforms of digital noises as shown in the dotted line frames of FIG. 3(B) can be obtained. That is, digital noises, whose center frequencies are in the reception band of the MR signals, arise.

When the digital noises as shown in FIG. 3(B) contaminate the RF coil 24 through the GND, signal lines, power supply lines, and the space, artifacts arise in frequency regions shown in the dotted line frames of FIG. 3(C).

A digital noise is represented by a formula as follows. An analog MR signal Sa(t) received by the RF coil 24 can be expressed as the formula (1).

$$Sa(t) = A \cos\{2\pi f_0 t + \phi(t)\} \quad (1)$$

In the formula (1), t represents time, A represents an amplitude of the MR signal, $f_0$ represents a center frequency of the MR signal, and $\phi(t)$ represents a phase of the MR signal.

The analog MR signal Sa(t) expressed by the formula (1) is quantized by N [bit], then the digitized MR signal Sd(t) can be expressed as the formula (2).

$$Sd(t) = A \cos\{2\pi f_0 t + \phi(t)\} \approx \Sigma[A \cos\{2\pi f_0 t + \phi(t)\} C_n(t) 2^{(n-1)}] \quad (2)$$

In the formula (2), $\Sigma$ represents the sum from n=1 to n=N, and $C_n$ represents a weight coefficient of the n-th bit.

Based on the formula (2), A digital noise noise(t) which arises in the latter part of the ADC 42 is expressed as the formula (3).

$$\text{noise}(t) \propto \Sigma[A \cos\{2\pi f_0 t + \phi(t)\} C_n(t)] \quad (3)$$

From the formula (3), it can be known that a signal modulated by mixing of the weight coefficient $C_n(t)$ with an MR signal arises as a digital noise noise(t).

As mentioned above, digital noises in a reception frequency band of the MR signals arise caused by the digitized MR signals when the ADC 42 is installed in the imaging room. Therefore, it is important to effectively prevent the digital noises from contaminating the RF coil 24. Furthermore, elements sensitive to noises, such as a preamplifier, a switch circuit for signal switching, and an amplifier for gain amplification, in addition to the RF coil 24 are located prior to the ADC 42. For this reason, it is desirable to prevent noises from contaminating plural circuits including the RF coil 24.

Accordingly, a noise suppression part 44 can be installed along the MR signal channels from the inside of the ADC 42 to the signal processing part 43. The noise suppression part 44 has a function to suppress noises, which arise due to the conversion from analog MR signals, before the down conversion, into digital MR signals, in at least one of the ADC 42 and the part between the ADC 42 and the signal processing part 43.

From the viewpoint of more effective suppression of the digital noises, it is preferable to tune the noise suppression part 44 so as to suppress noises in the resonant frequency band of at least one of the digital MR signals and the analog MR signals. Note that, the resonant frequency band of the digital MR signals can be considered to be substantially same as the resonant frequency band of the analog MR signals although it may slightly change from the resonant frequency band of the analog MR signals due to errors.

The noise suppression part 44 can be configured using plural elements. For example, it is effective to compose the noise suppression part 44 by an encoding part 45 and a decoding part 46. Furthermore, at least one of a low voltage differential signaling (LVDS) system 47, a ground plane (GND plane) 48, such as a wire mesh or a metal plate, for making an electric ground, shields 49, and connectors 50 having noise suppression effect can be used together as an element of the noise suppression part 44. Surely, other elements can be also added to the noise suppression part 44.

The encoding part 45 is a circuit for encoding the digital MR signals in the imaging room using at least one of a randomizer and a bit inversion circuit. The randomizer is the circuit for converting a digital MR signal which has a regularity into a digital MR signal which does not have a regularity. Moreover, the bit inversion circuit is the circuit for inverting each even bit or each odd bit of a digital MR signal. On the other hand, the decoding part 46 is the circuit for decoding the digital MR signals encoded by the encoding part 45.

That is, the digital MR signals output from the ADC 42 can be encoded by the encoding part 45 in the ADC 42 side to be transmitted to the signal processing part 43. Subsequently, the encoded digital MR signals can be decoded in the signal processing part 43 side. Therefore, the encoding part 45 is installed inside the ADC 42 or in the output side of the ADC 42. On the other hand, the decoding part 46 is installed inside the signal processing part 43 or in the input side of the signal processing part 43.

For effective suppression of generation of the digital noises from the transmission lines 51 between the ADC 42 and the signal processing part 43, it is preferable to install the encoding part 45 in the inside of the ADC 42, and to install the decoding part 46 in the inside of the signal processing part 43 as shown in FIG. 2. That is, it is preferable that the noise suppression part 44 is configured so as to encode the digital MR signals inside the ADC 42, and to decode the digital MR signals inside the signal processing part 43.

FIG. 5 is a circuit diagram showing an example of the encoding part 45 and the decoding part 46 shown in FIG. 2.

As shown in FIG. 5 as an example, the encoding part 45 can be configured by connecting the first bit inversion circuit 60A with the first randomizer 61A in series. On the other hand, the decoding part 46 can be configured by connecting the second bit inversion circuit 60B with the second randomizer 61B in series.

In the example shown in FIG. 5, each odd number [bit] out of N bits from 0 [bit] to N–1 [bit] is inverted by each NOT gate composing the first bit inversion circuit 60A. Surely, each even number [bit] may be inverted. Moreover, the MR signal after the bit inversion is converted into a random MR signal by the first randomizer 61A using XOR gates. On the other hand, in the decoding part 46, the MR signal before the bit inversion and also before the randomizing processing is restored by the second bit inversion circuit 60B and the second randomizer 61B similarly.

Figure 6:
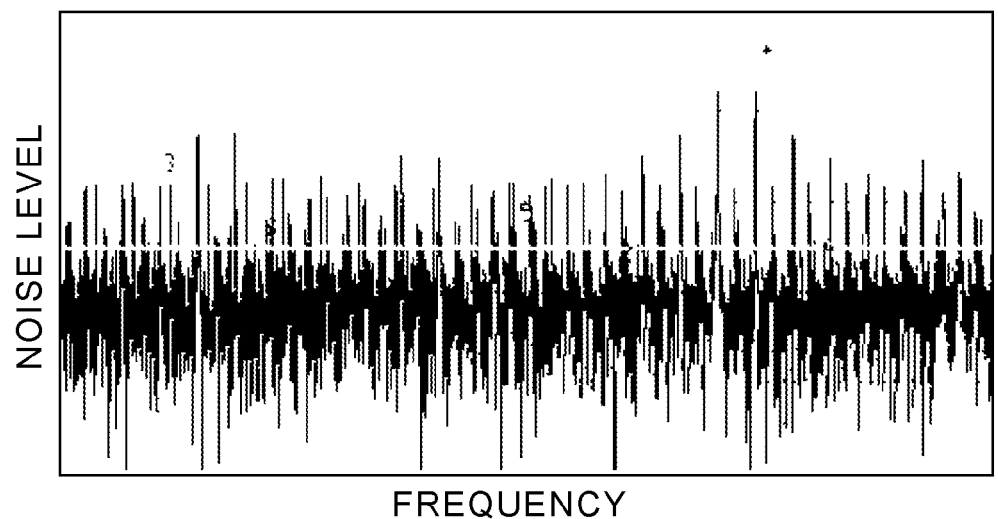
FIG. 6 shows a suppression effect of a digital noise by the bit inversion processing and the randomizing processing by the encoding part and the decoding part shown in FIG. 5.
Figure 6:
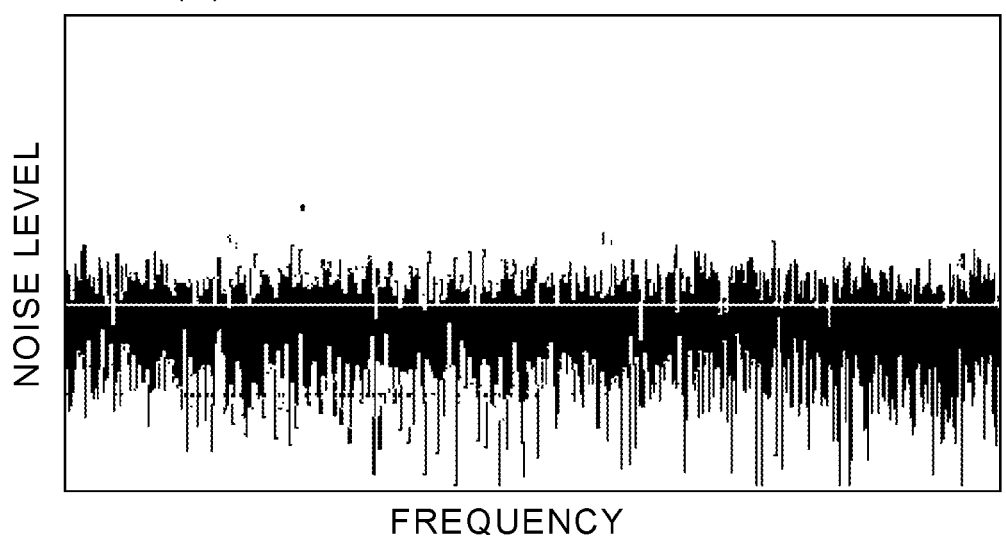

FIG. 6 shows a suppression effect of a digital noise by the bit inversion processing and the randomizing processing by the encoding part 45 and the decoding part 46 shown in FIG. 5.

FIG. 6(A) shows a frequency characteristic of digital noises in the case where the digital MR signals have not been encoded to be transmitted from the ADC 42 to the signal processing part 43. FIG. 6(B) shows a frequency characteristic of digital noises in the case where the digital MR signals have been subjected to the bit inversion and the randomizing to be transmitted from the ADC 42 to the signal processing part 43

According to FIG. 6, it can be confirmed that the digital noises are suppressed by the encoding of the MR signals including the bit inversion and the randomizing. Note that, performing either the bit inversion or the randomizing can also attain a suppression effect of digital noises. However, it is confirmed that performing both the bit inversion and the randomizing is more effective in the suppression of the digital noises to the sinc function.

When the bit inversion is performed to the digital MR signals, the effect to reduce both a frequency of cases where the number of bits whose values are 1 is large and a frequency of cases where the number of bits whose values are contrarily 0 is large can be attained. As a result, an intensity change in the digital MR signals can be reduced.

On the other hand, the randomizer is a circuit which inputs a bit value corresponding to the minimum digit and the other respective bit values to output the respective exclusive ORs, as shown in the FIG. 5 as an example. The value of bit corresponding to the minimum digit of MR signal (0 [bit] in the example shown in FIG. 5) has a low periodicity. Therefore, randomizing the digital MR signals using the randomizer can effectively reduce the periodicity of the MR signals.

Thus, it can be recognized that the digital noises can be suppressed by reducing at least one of the periodicity and the intensity change in the digital MR signals. For this reason, the encoding and decoding of the MR signals may be performed using an arbitrary signal processing circuit other than the bit inversion circuit and the randomizer so long as the signal processing circuit reduces at least one of the periodicity and the intensity change in the digital MR signals.

It is also effective for suppression of the digital noises to adopt the LVDS system 47 in order to transmit the MR signals between the ADC 42 and the signal processing part 43. The LVDS system 47 is a system which performs a differential conversion of each digital MR signal into two voltage signals to transmit the two voltage signals, and subsequently, performs a single ended conversion (restoration) of the digital MR signal by comparing the two voltage signals with each other. When the LVDS system 47 is installed between the ADC 42 and the signal processing part 43, the differential conversion of a digital MR signal into two voltage signals can be performed inside the imaging room while the single ended conversion of the digital MR signal can be performed inside the imaging room or outside the imaging room.

Moreover, the digital noises tend to be radiated from the transmission lines 51 of the MR signals between the ADC 42 and the signal processing part 43. Therefore, it is preferable that the transmission lines 51 of the MR signals between the ADC 42 and the signal processing part 43 are shortened as much as possible.

Furthermore, it is also effective to use connectors, each protected by a GND plane, as the connectors 50 which compose the transmission lines 51 of the digital MR signals between the ADC 42 and the signal processing part 43. Thereby, the impedance in each transmission line 51 can be stabilized. As an alternative, an electromagnetically shielded shield connector may be also used as each of the connectors 50 which compose the transmission lines 51 of the digital MR signals between the ADC 42 and the signal processing part 43.

Moreover, it is also effective for the transmission lines 51 of the digital MR signals, between the ADC 42 and the signal processing part 43, to be covered by the GND plane 48 as illustrated.

In addition to the GND plane 48 or as an alternative to the GND plane 48, it is also effective to electromagnetically shield at least one of the ADC 42, the signal processing part 43, and the transmission lines 51 of the digital MR signals, between the ADC 42 and the signal processing part 43, by a shield. However, if the ADC 42 is shielded by a shield case, enough heat radiation may be possibly difficult. Accordingly, the transmission lines 51 and the signal processing part 43 are covered by the shields 49, in the illustrated example. Thereby, the digital noises radiated from the transmission lines 51 and the signal processing part 43 can be blocked.

That is, the magnetic resonance imaging apparatus 20 as mentioned above is configured to allow circuits, prior to at least the ADC 42, composing the receiver 30 to be installed in an imaging room by suppressing digital noises, arising from the latter part of the ADC 42 which performs the direct sampling of MR signals, using the noise suppression part 44.

For this reason, according to the magnetic resonance imaging apparatus 20, digital noises which arise in the ADC 42 and the transmission lines 51 of MR signals in the latter part of the ADC 42 can be attenuated in the case where the MR signals are directly sampled. Especially, leaks of noises in the transmission lines 51 can be effectively prevented by transmitting encoded MR signals. This enables one to prevent digital noises from contaminating the reception RF coil 24 thus suppressing artifacts. As a result, MR imaging can be performed with an improved image quality even when the ADC 42 and the like of the receiver 30 are installed in the imaging room.

Note that, a receiver which does not perform the direct sampling of MR signals can also attain a suppression effect of digital noises by installing the noise suppression part 44 in the output side of the ADC 42.

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   MRI system components including static and gradient magnetic field generators, at least one radio frequency (RF) coil and analog-to-digital (AD) converter circuitry co-located inside an imaging room and at least one control processor connected to control said components, said control processor being configured to
      acquire analog magnetic resonance (MR) signals from an object and directly sample the analog MR signals in order to convert them into digital (MR) signals inside said imaging room before down conversion in frequency; and
      process the digital MR signals and generate magnetic resonance image data therefrom either inside the imaging room or outside the imaging room; and
   noise suppression circuitry that is connected to condition said digital MR signals in said operating room before frequency down-conversion and configured to suppress RF noise, within a band of received MR signal frequencies, caused by the directly-sampled AD conversion, wherein said noise suppression circuitry comprises
      encode circuitry configured to encode the digital MR signal with randomizer circuitry that is configured to randomize regularity of bits and/or bit inversion circuitry configured to invert every other bit of the digital MR signals, and
      decode circuitry that is configured to decode the encoded digital MR signals which are then output as digital MR signals and processed to generate said magnetic image data.

2. The magnetic resonance imaging apparatus of claim 1, wherein
   said noise suppression circuitry is configured to suppress the noise by reducing at least one of (i) a periodicity and (ii) an intensity variation of the digital MR signals.

3. The magnetic resonance imaging apparatus of claim 1, wherein
   said noise suppression circuitry is tuned to suppress noise in a resonance frequency band including at least one of the digital MR signals and the analog MR signals.

4. The magnetic resonance imaging apparatus of claim 1, wherein
   said noise suppression circuitry includes a low voltage differential signaling system configured to perform a differential conversion of the digital MR signals into two voltage signals, inside the imaging room, and to transmit the two voltage signals to a receiving circuit located either inside or outside the imaging room that has been configured to perform a single ended conversion of the two voltage signals back into the digital MR signals by comparing the two voltage signals.

5. The magnetic resonance imaging apparatus of claim 1, wherein
   said noise suppression circuitry includes a ground plane covering a transmission line, of the digital MR signals, between said AD converter circuitry and a signal receiving and processing circuit.

6. The magnetic resonance imaging apparatus of claim 1, wherein
   said noise suppression circuitry includes a shield electromagnetically shielding at least one of said AD converter circuitry, digital MR signal receiving and processing circuitry and a transmission line, of digital MR signals, that passes between said AD converter circuitry and said digital MR signal receiving and processing circuitry.

7. The magnetic resonance imaging apparatus of claim 1, wherein
   said noise suppression circuitry includes an electromagnetically shielded connector comprising a transmission line passing the digital MR signals, between said AD converter circuitry and signal digital MR signal receiving and processing circuitry.

8. The magnetic resonance imaging apparatus of claim 1, wherein
   said noise suppression circuitry includes a connector protected by a ground plane, that forms at least part of a transmission line connection which passes the digital MR signals between said AD converter circuitry and digital MR signal receiving and processing circuitry.

9. A magnetic resonance imaging (MRI) method comprising:
   acquiring and directly sampling analog MR signals from an object in an imaging room co-located with MRI system components including static and gradient magnetic field generators and at least one radio frequency (RF) coil, in order to convert MR signals into digital MR signals before frequency down-conversion; and
   generating MR image data based on the converted digital MR signals by processing performed inside or outside the imaging room; and
   suppressing RF noise in the resulting digital MR signals within the imaging room that are within a band of received MR signal frequencies caused by the directly sampled conversion of the analog MR signals in the imaging room, before down conversion to a lower frequency,
   wherein said suppressing RF noise comprises:
      (a) encoding the digital MR signals by (i) randomizing regularity of bits and/or (ii) inverting every other bit of the digital MR signals and
      (b) decoding the encoded digital MR signals and outputting the decoded MR signals as digital MR signals that are then processed in order to generate said MR image data.

10. A Magnetic resonance imaging (MRI) apparatus comprising:
    an analog-to-digital (AD) converter disposed in an imaging room and configured to directly sample and convert analog magnetic resonance (MR) signals, acquired by static and gradient magnetic field generators and an RF (radio frequency) coil co-located within said imaging room, into digital MR signals before down conversion to a lower frequency; and
    processing circuitry, including noise suppression encode circuitry which suppresses RF noise before down conversion to a lower frequency and decode circuitry, that are connected in order to process said digital MR signals, with at least the encode circuitry being located within said imaging room,
    the encode circuitry also being configured to encode the digital MR signals by using (i) a randomizer configured to randomize regularity of bits and/or (ii) bit inversion circuitry configured to invert every other bit of the digital MR signals, and the decode circuitry being configured to decode the previously encoded digital MR signals which are then output as digital MR signals and further processed by the processing circuitry in order to generate magnetic image data.

* * * * *